(12) United States Patent
Tsurunari et al.

(10) Patent No.: US 6,856,213 B2
(45) Date of Patent: Feb. 15, 2005

(54) HIGH FREQUENCY COMPOSITE SWITCH MODULE

(75) Inventors: Tetsuya Tsurunari, Osaka (JP); Yuki Satoh, Osaka (JP); Yoshiharu Omori, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 117 days.

(21) Appl. No.: 10/148,699

(22) PCT Filed: Oct. 5, 2001

(86) PCT No.: PCT/JP01/08793

§ 371 (c)(1),
(2), (4) Date: Oct. 3, 2002

(87) PCT Pub. No.: WO02/32002

PCT Pub. Date: Apr. 18, 2002

(65) Prior Publication Data

US 2004/0119560 A1  Jun. 24, 2004

(30) Foreign Application Priority Data

Oct. 6, 2000  (JP) ........................................ 2000-307277

(51) Int. Cl.[7] ................................................. H03H 9/72
(52) U.S. Cl. ......................... 333/133; 333/101; 333/193
(58) Field of Search .............................. 333/101, 133, 333/193–196

(56) References Cited

U.S. PATENT DOCUMENTS

| | | | | |
|---|---|---|---|---|
| 5,699,027 A | * | 12/1997 | Tsuji et al. ................. | 333/193 |
| 5,914,646 A | * | 6/1999 | Hashimoto ................. | 333/195 |
| 6,445,262 B1 | * | 9/2002 | Tanaka et al. .............. | 333/133 |
| 6,456,172 B1 | * | 9/2002 | Ishizaki et al. ............. | 333/133 |
| 6,570,469 B2 | * | 5/2003 | Yamada et al. ............. | 333/193 |
| 6,606,015 B2 | * | 8/2003 | Uriu et al. .................. | 333/132 |
| 6,628,178 B2 | * | 9/2003 | Uchikoba ................... | 333/193 |

FOREIGN PATENT DOCUMENTS

| | | |
|---|---|---|
| EP | 0 637 871 A1 * | 2/1995 |
| EP | 0 667 685 | 8/1995 |
| EP | 0 921 642 | 6/1999 |
| JP | 6-334560 | 12/1994 |
| JP | 7-99420 | 4/1995 |
| JP | 7-240241 | 9/1995 |
| JP | 8-181035 | 7/1996 |

OTHER PUBLICATIONS

Nikkei Electronics, No. 776, pp. 47–54, Aug. 14, 2000 (w/partial English translation).
Communication Purusant to Article 115(2) EPC dated May 4, 2004.

* cited by examiner

Primary Examiner—Barbara Summons
(74) Attorney, Agent, or Firm—RatnerPrestia (57) ABSTRACT

A radio frequency (RF) hybrid switch module includes an antenna duplexer integrated with a surface acoustic wave (SAW) filter used in a mobile communication device such as a cellular phone. The switch module handles a transmitted signal and received signal of different frequency bands. A parasitic inductance due to a mounting of the SAW filter is reduced, so that an attenuation characteristic at a low frequency of the SAW filter is improved. The RF hybrid switch module includes: a dividing circuit; a switching circuit; a low pass filter (LPF); an electrode for forming at least a portion of the dividing circuit, switching circuit, and the LPF; a laminated body including a dielectric layer having the electrode formed thereon; a SAW filter which is mounted on the laminated body, corresponds to plural frequency bands, and has a grounding port; a diode mounted on the laminated body for forming a portion the switching circuit, a grounding electrode formed in the laminated body, and a via-conductor directly connecting the grounding port of the SAW filter.

22 Claims, 10 Drawing Sheets

HIGH FREQUENCY COMPOSITE SWITCH MODULE

THIS APPLICATION IS A U.S. NATIONAL PHASE APPLICATION OF PCT INTERNATIONAL APPLICATION PCT /JP01/08793.

TECHNICAL FIELD

The present invention relates to a radio frequency (RF) hybrid switch module used in a mobile communication device such as a cellular phone.

BACKGROUND ART

Figure 11:
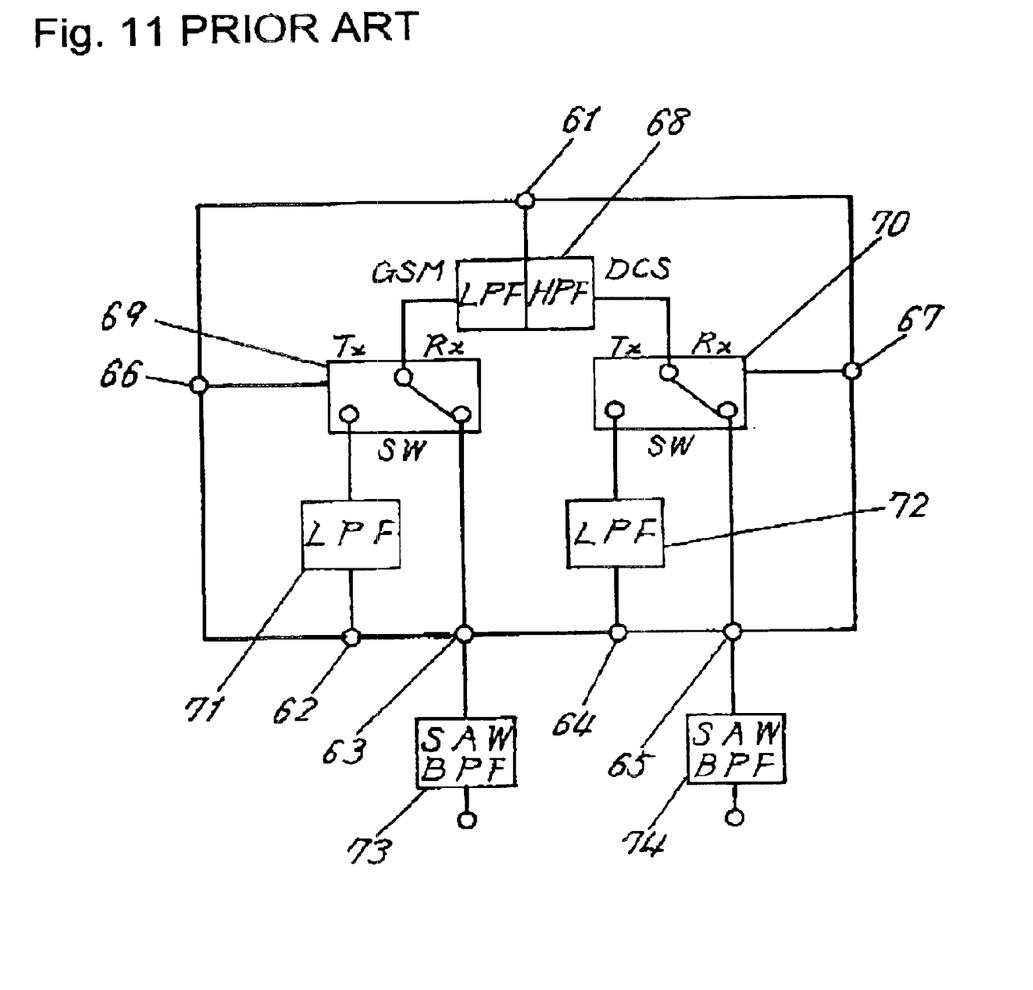
FIG. 11 is a circuit block diagram of a conventional RF component.

A small, high-efficiency dividing circuit and antenna duplexer used in a mobile communication device such as a cellular phone have been recently demanded. A conventional circuit block diagram of a radio frequency (RF) component such as the mobile communication device is shown in FIG. 11. FIG. 11 shows an antenna duplexer in a composite terminal for a GSM system at 900 MHz band, which is used at a cellular phone in Europe, and a DCS system at 1.8 GHz band.

As shown in FIG. 11, the RF component includes antenna port 61, transmitting ports 62, 64, receiving ports 63, 65, control terminals 66, 67, dividing circuit 68, switching circuits 69, 70 and low pass filters 71, 78. Dividing circuit 68, being generally formed of a low pass filter and high pass filter, divides a received signal into a GSM band and a DCS band. Switching circuits 69, 70 switch between a transmitting signal and a received signal at respective bands.

Figure 12:
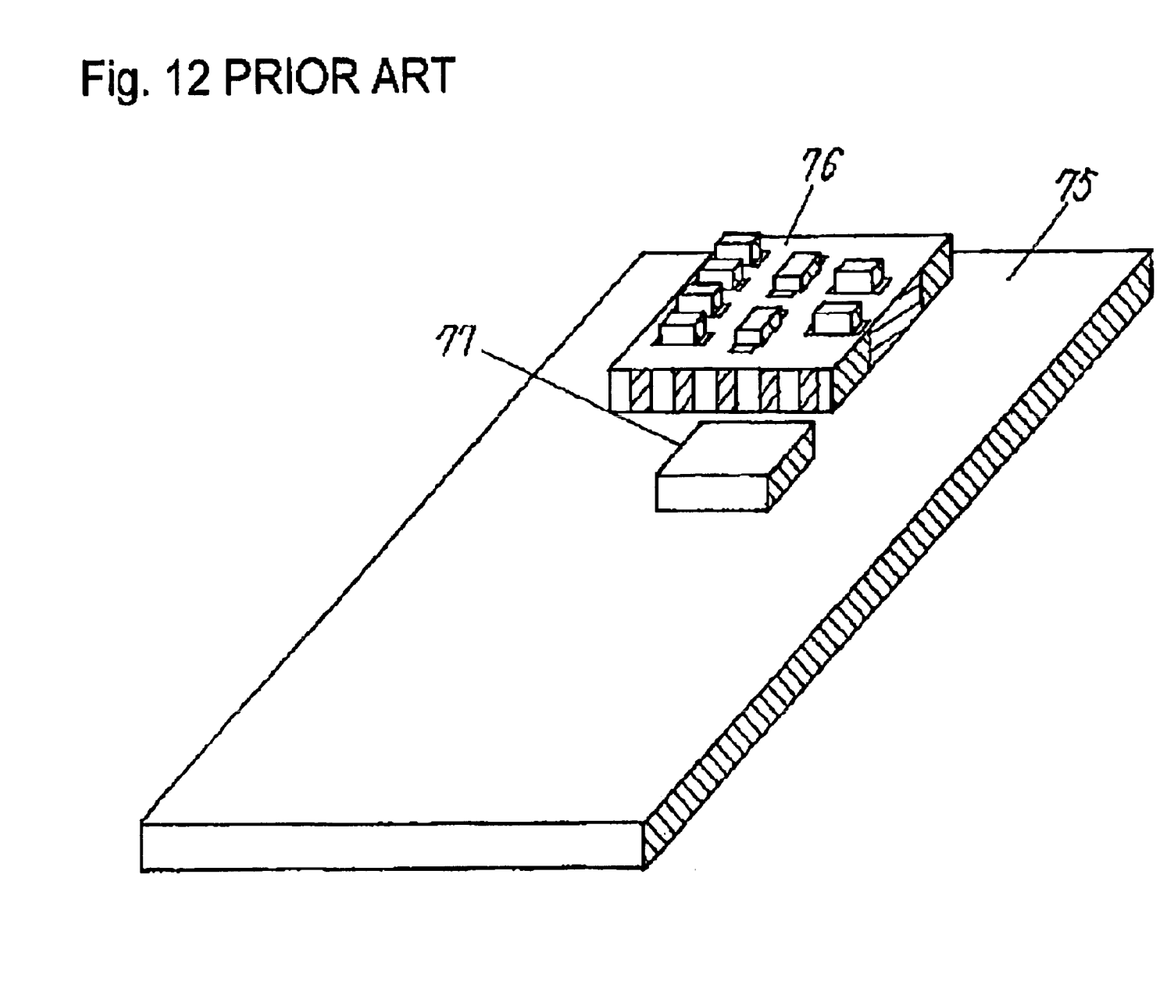
FIG. 12 is the conventional RF component mounted on a board.

The receiving ports are connected with respective band-pass filters, e.g., surface acoustic wave (SAW) filters 73, 74, for limiting receiving bands. As shown in FIG. 12, antenna duplexer 76 and SAW filter 77 are mounted individually on board 75 of the cellular phone, thus requiring a large mounting area.

The cellular phone is recently required, for a further convenience, to be small as well as to have a multi-band function and more functions. An antenna duplexer responsive to the requirement is accordingly demanded.

The above-mentioned antenna duplexer, since including the antenna duplexer and band-pass filter mounted individually on the board, requires a land and a space for connecting the duplexer with the filter. This makes a communication device including the antenna duplexer be hardly small. Further, since the individual components are connected with each other, a signal is transmitted on the board. This creates a loss of the signal on the board, thus reducing a receiving sensitivity of the communication device.

The SAW filter used for the band-pass filter for limiting the receiving band is influenced by a parasitic inductance produced between a ground and a SAW resonator connected with the ground. That is, the inductance shifts an attenuation pole at a lower frequency in an attenuation band toward a lower frequency, and decreases an amount of attenuation at the pole. The SAW filter, when being integrated with the antenna-duplexer formed in a laminated body, has a grounding port thereof coupled with a grounding terminal via a leading line and a via-conductor in the laminated body. As a result, a parasitic inductance of the leading line reduces an attenuation amount at a lower frequency of the SAW filter.

SUMMARY OF THE INVENTION

A radio frequency (RF) hybrid switch module includes an antenna duplexer used in a mobile communication device such as a cellular phone, and a surface acoustic wave (SAW) filter integrated therein. The module handles transmitted signals and received signals of different frequency bands. a parasitic inductance due to the mounting of the SAW filter is reduced, and the SAW filter has an improved attenuation characteristic at a lower frequency.

The RF hybrid switch module includes: a dividing circuit; a switching circuit; a low pass filter (LPF); an electrode pattern forming at least a portion of the dividing circuit, switching circuit, and LPF; a laminated body including a plurality of dielectric layers, the electrode pattern being formed on at least one of the dielectric layers; a surface acoustic wave (SAW) filter corresponding to the frequency bands, having a grounding port, being mounted on the laminated body; a diode mounted on the laminated body, for forming a portion of the switching circuit; a grounding electrode formed in the laminated body; and a via-conductor directly connecting the grounding port of the SAW filter.

DESCRIPTION OF THE PREFERRED EMBODIMENT

Figure 1:
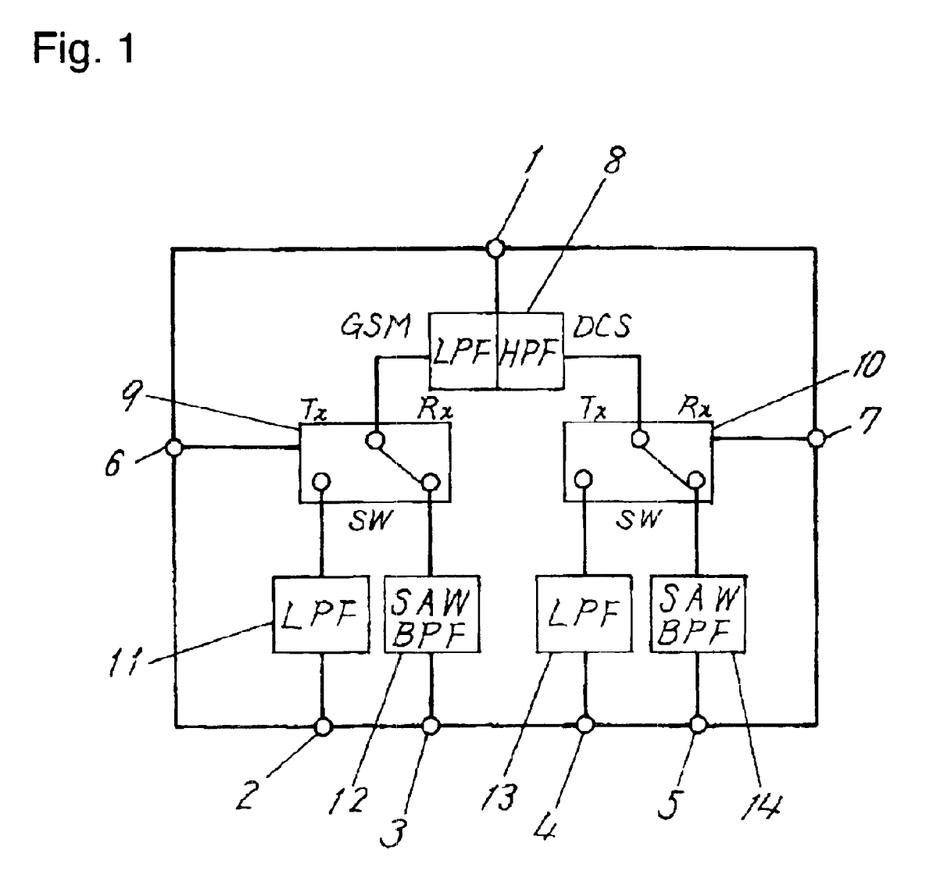
FIG. 1 is a circuit block diagram of a radio frequency (RF) switch module in accordance with an exemplary embodiment of the present invention.

FIG. 1 is a circuit block diagram of a radio frequency (RF) hybrid switch module in accordance with an exemplary embodiment of the present invention. The RF hybrid switch module is formed of a circuit shown in FIG. 1 and formed as a one-chip module. The module corresponds two frequency bands (e.g. a GSM band as a first frequency band and a DCS band as a second frequency band), and can be used for dividing a received signal and a transmitted signal in the GSM and DCS bands between an antenna of a dual-band cellular phone.

The RF hybrid switch module operates in two transmitting/receiving systems, e.g. a GSM system and a DCS system, having different frequency bands. The RF hybrid switch module includes: dividing circuit 8 for dividing a received signal into the first frequency band (the GSM band) and the second frequency band (the DCS band), and for mixing the signals; switch 9 for switching between a transmitted signal and a received signal of a first transmitting/receiving system (the GSM system); low pass filter (LPF) 11 coupled with a transmitting line of switch 9; surface acoustic wave (SAW) filter 12 coupled with a receiving line of switch 9; switch 10 for switching between a transmitted signal and a received signal of a second transmitting/receiving system (the DCS system); LPF 13 coupled with a transmitting line of switch 10; and SAW filter 14 coupled with a receiving line of switch 10.

Figure 2:
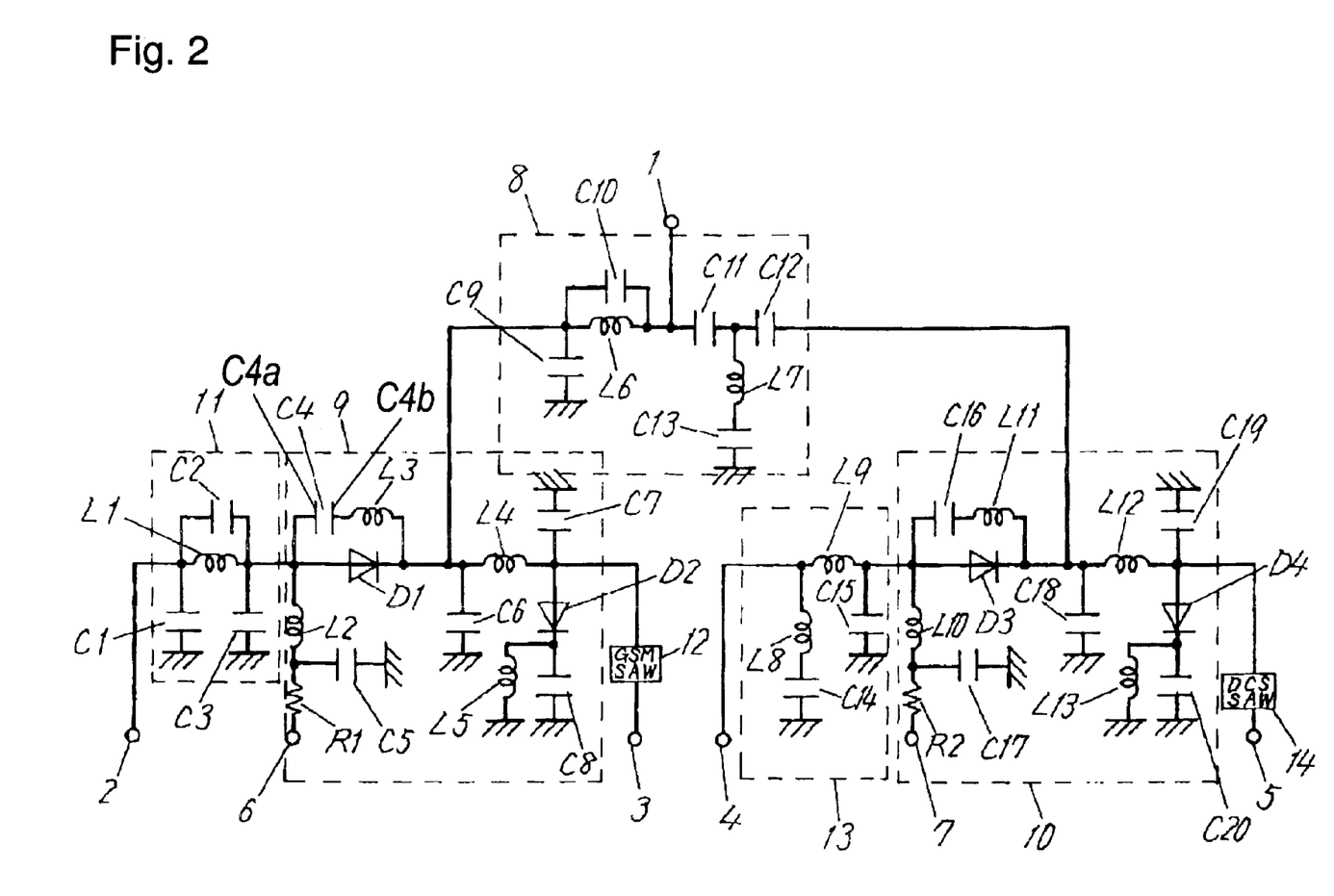
FIG. 2 is an equivalent circuit diagram of the module in accordance with the embodiment.

FIG. 2 is an equivalent circuit diagram of the RF hybrid switch module. LPF 11 is formed of capacitors C1 through C3 and inductor L1. LPF 13 is formed of capacitors C14 and C15 and inductors L8 and L9. Switch 9 is formed of capacitors C4 through C8, inductors L2 through L5, and diodes D1 and D2. Switch 10 is formed of capacitors C16 through C20, inductors L10 through L13, and diodes D3 and D4. Dividing circuit 8 is formed of capacitors C9 through C12 and inductors L6 and L7.

A parallel resonant circuit formed of capacitor C10 and inductor L6 resonates approximately at the second frequency band, and a series resonant circuit formed of capacitor C13 and inductor L7 resonates approximately at the first frequency band.

Diode D2 and capacitor C8 series-resonate at a first transmitting frequency, so that an impedance of a receiving side measured at an antenna terminal can be local-maximized by phase rotation of a $\pi$-type phase-circuit formed of capacitors C6 and C7 and inductor L4. As a result, switch 9 for switching between transmitting and receiving can be formed with diodes D1 and D2.

Capacitor C4 and inductor L3 cancel a capacitance of turned-off diode D1 at a first received frequency band. Inductor L2 is a choke inductor, and capacitor C5 is a by-pass capacitor.

Diode D4 and capacitor C20 series-resonate at a second transmitting frequency, so that an impedance of a receiving side measured at the antenna terminal can be local-maximized by phase rotation of a $\pi$-type phase-circuit formed of capacitors C18 and C19 and inductor L12. As a result, switch 10 for switching between transmitting and receiving can be formed with diodes D3 and D4.

Capacitor C16 and inductor L11 cancel a capacitance of turned-off diode D3 at a second received frequency band. Inductor L10 is a choke inductor, and capacitor C17 is a by-pass capacitor.

Figure 3:
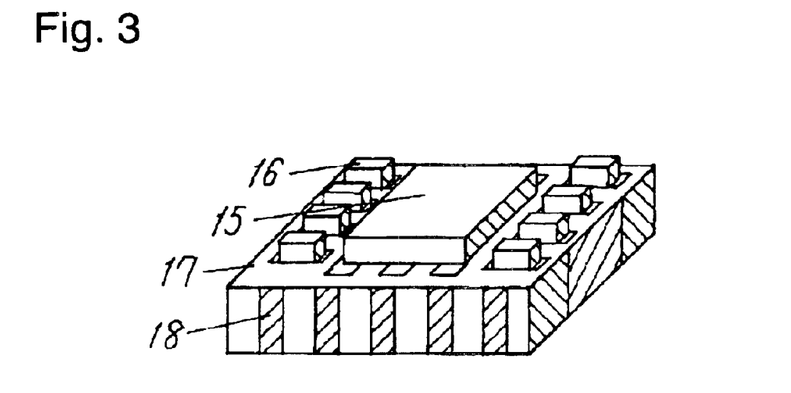
FIG. 3 shows an outward appearance of the module in accordance with the embodiment.

FIG. 3 shows an outward appearance of the RF hybrid switch module formed as a one chip module. A portion of the dividing circuits, LPFs and switching circuits are formed in a laminated body. Chip component 16, e.g., a diode or a chip inductor, and SAW filter 15, which transmits a signal in the first receiving band and the second receiving band, are mounted on laminated body 17.

Laminated body 17 is formed of laminated dielectric layers each having a low dielectric constant ($\epsilon r<10$). In the laminated body, an inductor is formed of a meandered or spiral electrode pattern, and a capacitor is formed of electrodes facing each other. An input/output electrode and grounding electrode 18 are formed on the side of the laminated body.

Figure 4:
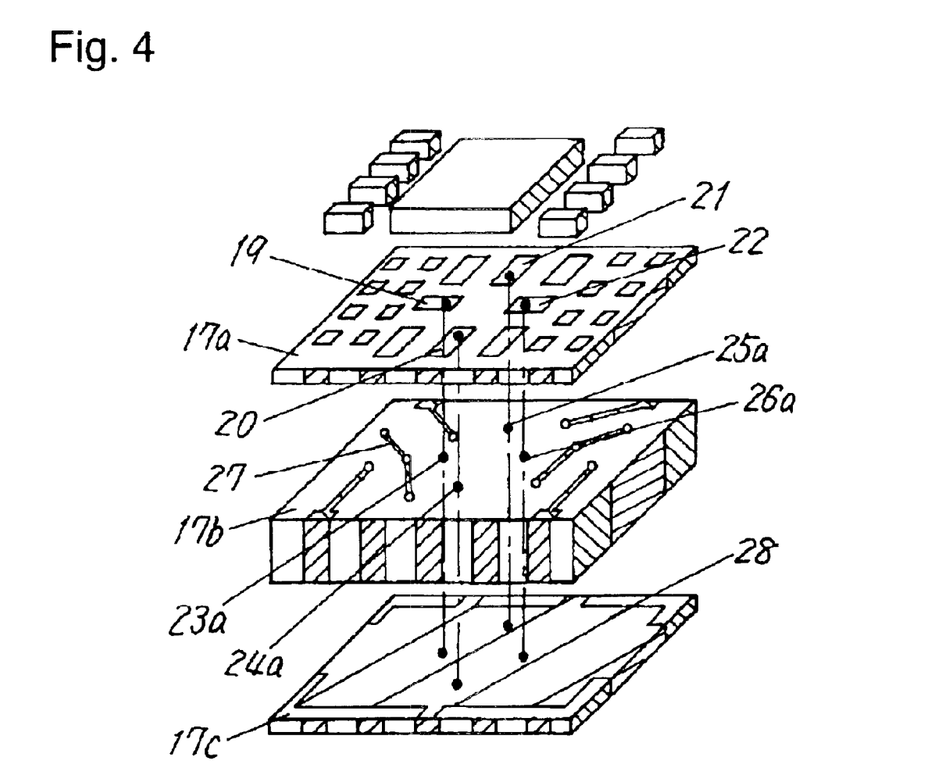
FIG. 4 is an exploded perspective view of the module in accordance with the embodiment.
Figure 6A:
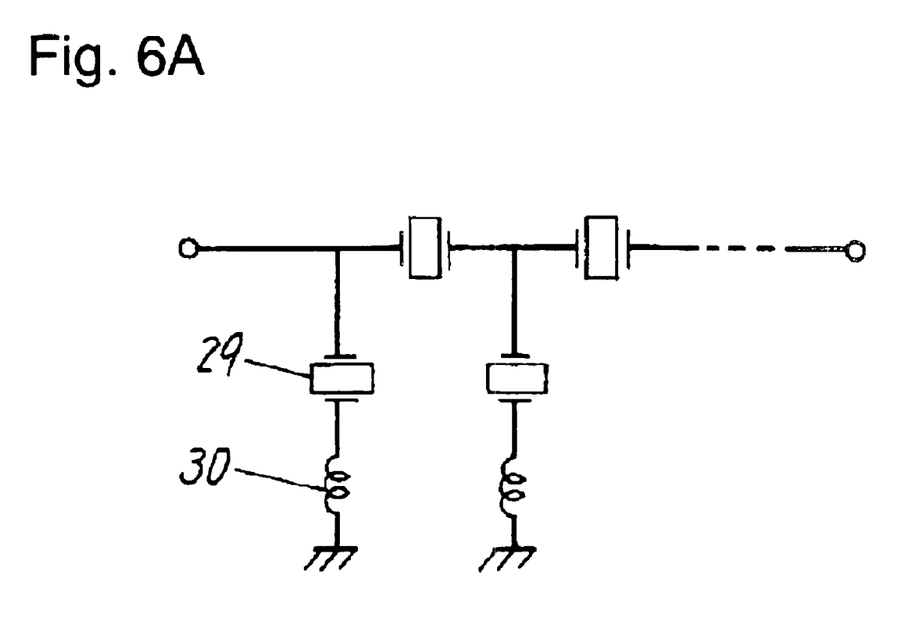
FIG. 6A is an equivalent circuit diagram of a surface acoustic wave (SAW) filter in accordance with the embodiment.
Figure 6B:
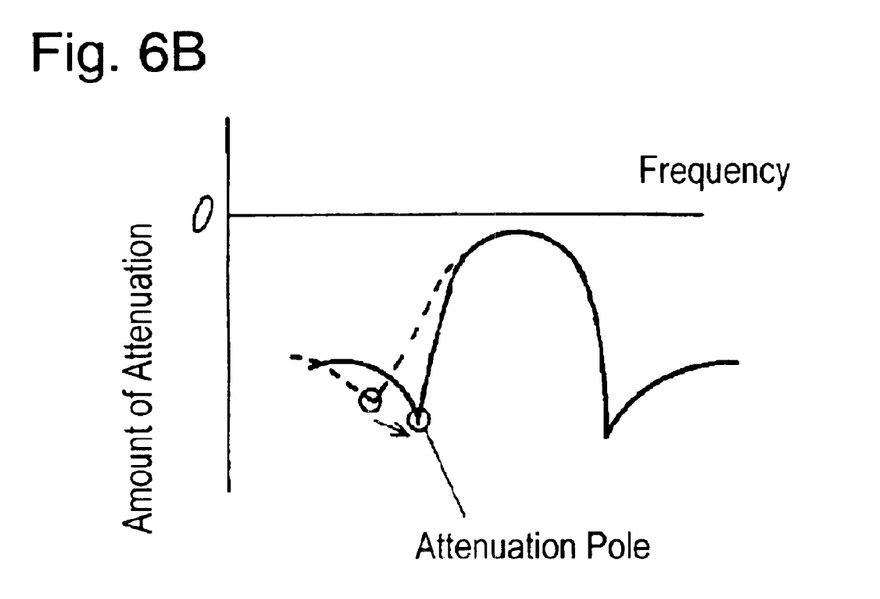
FIG. 6B is a characteristic diagram of the SAW filter in accordance with the embodiment.

FIG. 4 is an exploded perspective view of the module shown in FIG. 3. Laminated body 17 is divided into laminated bodies 17a, 17b and 17c as shown in FIG. 4. Grounding terminal 19 to 22 for mounting SAW filter are directly connected with grounding electrode 28 formed on laminated body 17c through respective via-holes 23a to 26a formed in laminated bodies 17a and 17b. As shown in FIG. 6A, this structure discussed above reduces parasitic inductance 30 produced between a ground and SAW resonator 29. As shown in FIG. 6B, a series resonant frequency of SAW resonator 29 thus does not shift largely toward a lower frequency. This suppresses a shift of a frequency of an attenuation pole at a low frequency of the SAW filter, and a reduction of an attenuation.

Figure 5:
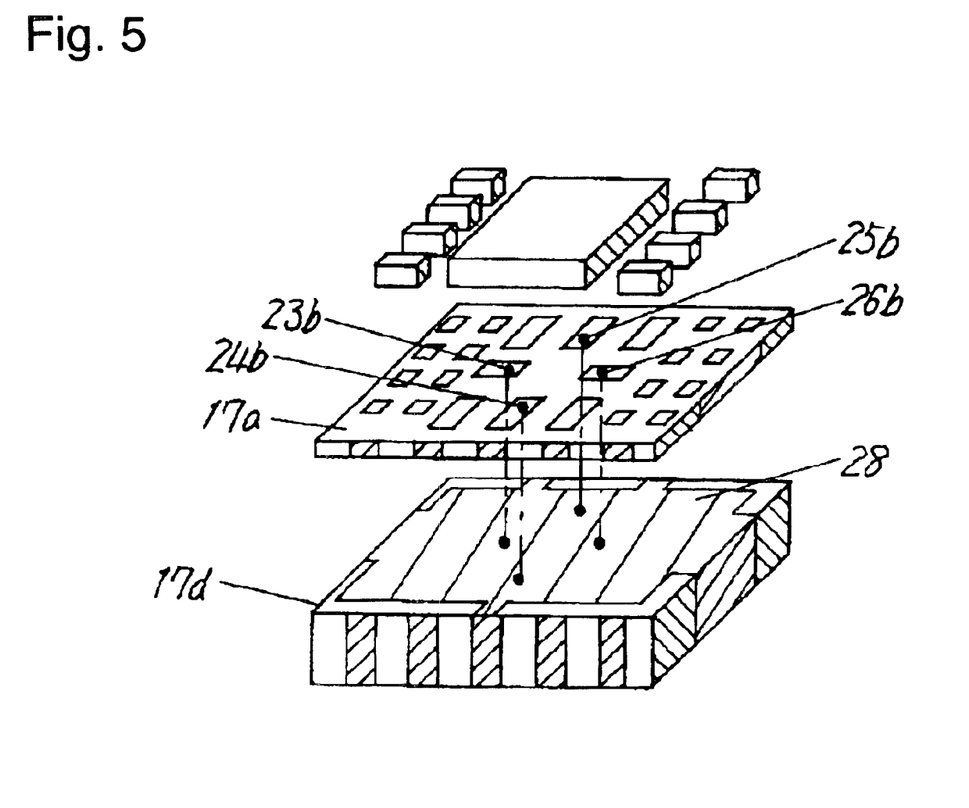
FIG. 5 is an exploded perspective view of another RF switch module in accordance with the embodiment.

In FIG. 4, grounding electrode 28 is formed on a bottom laminated body, however, in FIG. 5, grounding electrode 28 is formed on laminated body 17d disposed near the top body. In this structure, via-holes 23b to 26b become shorter by a thickness of laminated body 17b, thus reduces the parasitic inductance and restrains the attenuation reduction of the SAW filter more.

The grounding terminal, upon being connected with a grounding electrode through plural via-holes, reduces the parasitic inductance and restrains the attenuation reduction of the SAW filter.

Figure 7:
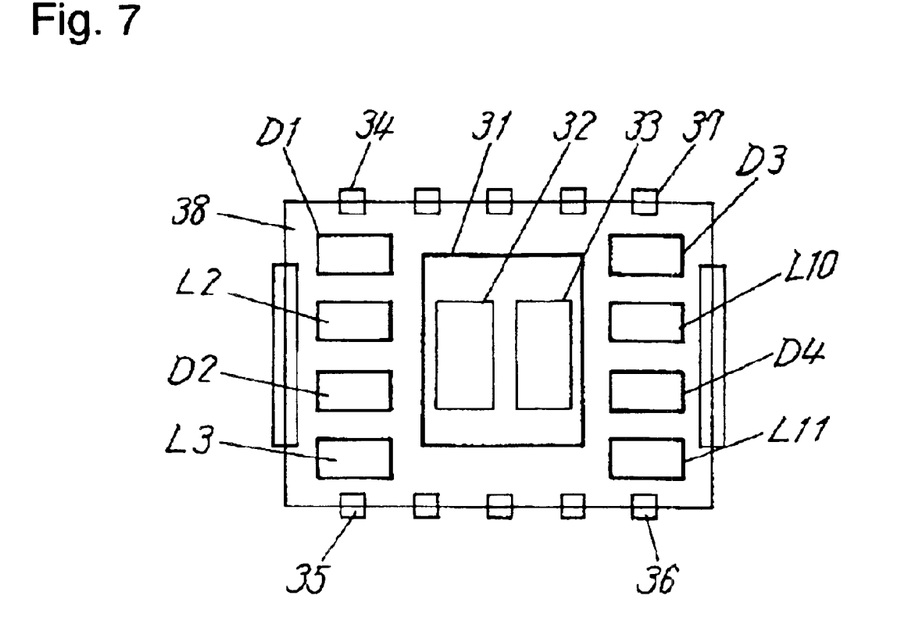
FIG. 7 is a plan view showing a mounting condition and a terminal arrangement of the RF switch module in accordance with the embodiment.
Figure 8:
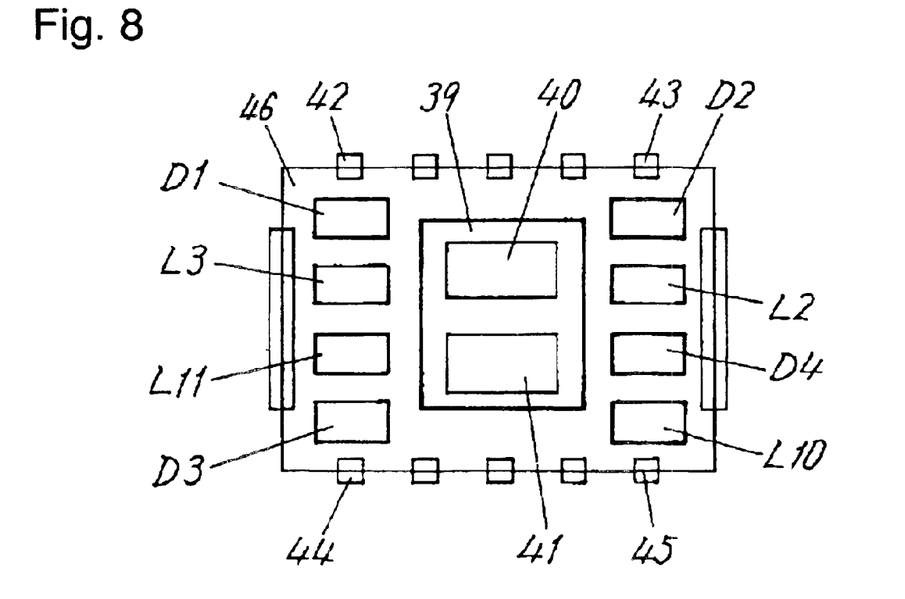
FIG. 8 is a plan view showing a mounting condition and a terminal arrangement of the RF switch module in accordance with the embodiment.
Figure 9:
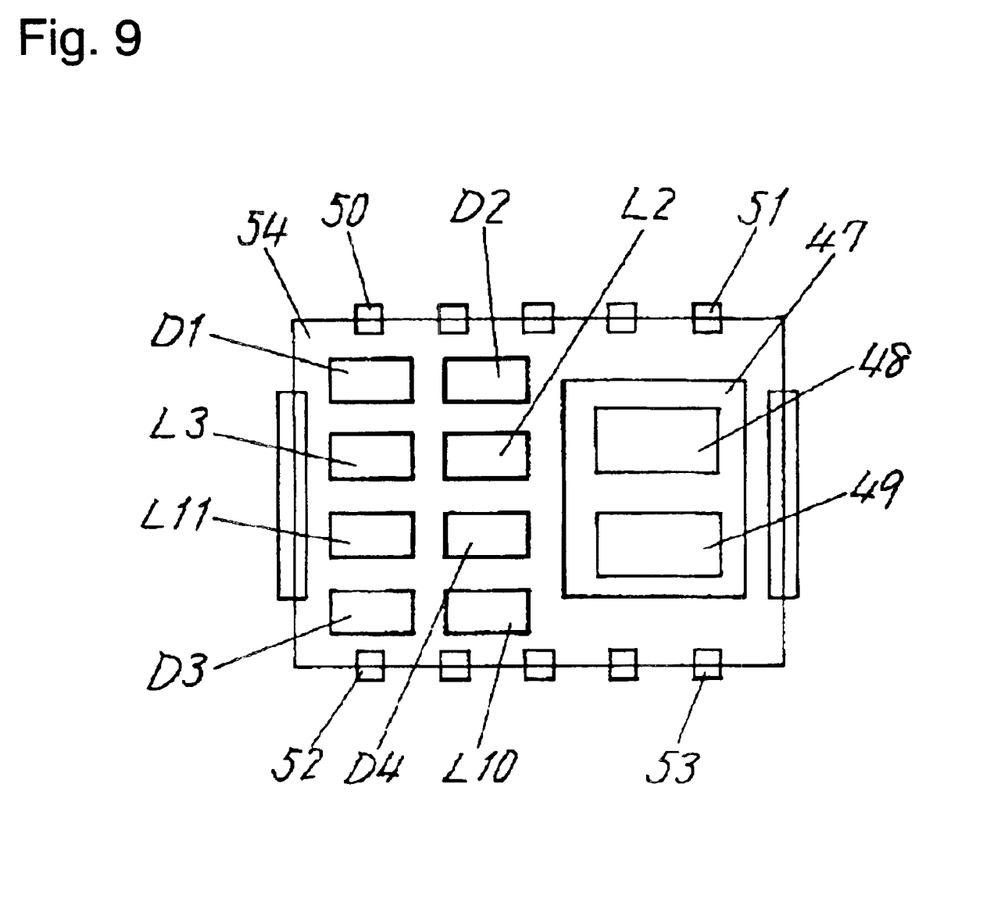
FIG. 9 is a plan view showing a mounting condition and a terminal arrangement of the RF switch module in accordance with the embodiment.

The SAW filter used in the RF hybrid switch module of this embodiment includes at least two SAW elements corresponding to the first and second frequency bands, respectively. FIGS. 7 through 9 are plan views showing mounting conditions and terminal arrangements of the SAW filters and RF chip components.

In FIG. 7, SAW filter 31 is disposed on a center of laminated body 38. First SAW element 32 and second SAW element 33 are disposed side by side in the longitudinal direction of laminated body 38. A portion of circuits and filters corresponding to the first frequency band is formed on a region of the laminated body near first SAW element 32. The portion of the circuits and filters is formed of diodes D1 and D2, chip inductors L2 and L3, first transmitting terminal 34, first receiving terminal 35, capacitors C1 through C10, and inductors L1 and L4 through L6. The diodes and chip inductors are mounted on the laminated body, and the capacitors and inductors are formed of electrodes.

A portion of the circuits and filters corresponding to the second frequency band is formed in a region of the laminated body near second SAW element 33. The portion of the circuits and the filters is formed of diodes D3 and D4, chip inductors L10 and L11, second transmitting terminal 36, second receiving terminal 37, capacitors C11 through C20 and inductors L7 through L9, L12, and L13. The diodes and chip inductors are mounted on the laminated body, and the capacitors and inductors are formed of electrodes. This arrangement reduces mutual interference between circuits operating at respective frequency bands. This arrangement also reduces a coupling between transmitting terminals and receiving terminals, and thus improves isolation between the terminals.

In FIG. 8, SAW filter 39 is disposed on a center of laminated body 46. First SAW element 40 and second SAW element 41 are disposed adjacent each other vertically to the longitudinal direction of laminated body 46. Transmitting terminal 42 and receiving terminal 43 for the first frequency band are disposed apart from each other on an area near the first SAW element. Transmitting terminal 44 and receiving terminal 45 for the second frequency band are disposed apart from each other on an area near the second SAW element.

A conductor such as another terminal may be formed between the transmitting terminal and receiving terminal. The transmitting terminal and receiving terminal may be formed apart from each other at edges of the laminated body. This reduces a coupling between the transmitting terminals and receiving terminals, and thus improves isolation between them.

In FIG. 8, a portion of circuits and filters corresponding to the first frequency band is formed in a region of the laminated body near first SAW element 40. The portion of the circuits and the filters is formed of diodes D1 and D2, chip inductors L2 and L3, capacitors C1 through C10 and inductors L1, L4 through L6. The diodes and chip inductors are mounted on the laminated body, and the capacitors and inductors are formed of electrodes. A portion of the circuits and filters corresponding to the second frequency band is formed in a region of the laminated body near second SAW element 41. The portion of the circuits and filters is formed of diodes D3 and D4, chip inductors L10 and L11, capacitors C11 through C20 and inductors L7 through L9, L12, and L13. The diodes and chip inductors are mounted on the laminated body, and the capacitors and inductors are formed of electrodes. This arrangement reduces mutual interference between circuits operating at respective frequency bands, and thus improves isolation between them.

In FIG. 9, SAW filter 47 is disposed at one side on laminated body 54. First SAW element 48 and second SAW element 49 are disposed adjacent each other vertically to the longitudinal direction of laminated body 54. Transmitting terminal 50 and receiving terminal 51 for the first frequency band are formed apart from each other on an area near first SAW element 48 on the laminated body. Transmitting terminal 52 and receiving terminal 53 for the second frequency band are formed apart from each other on an area near second SAW element 47 on the laminated body. A conductors such as another terminal may be formed between the transmitting terminal and receiving terminal. The transmitting terminal and receiving terminal may be formed apart from each other at respective edges of the laminated body. This arrangement reduces a coupling between the transmitting terminals and receiving terminals, and thus improves isolation between them.

In FIG. 9, a portion of circuits and filters corresponding to the first frequency band is formed in a region of the laminated body near first SAW element 48. The portion of the circuits and the filters is formed of diodes D1 and D2, chip inductors L2 and L3, capacitors C1 through C10 and inductors L1, L4 through L6. The diodes and chip inductors are mounted on the laminated body, and the capacitors and inductors are formed of electrodes. A portion of the circuits and filters corresponding to the second frequency band, is formed in a region of the laminated body near second SAW device 47. The portion of the circuits and the filters is formed of diodes D3 and D4, chip inductors L10 and L11, capacitors C11 through C20 and inductors L7 through L9, L12, and L13. The diodes and chip inductors are mounted on the laminated body, and the capacitors and inductors are formed of electrodes. This arrangement reduces mutual interference between circuits operating at respective frequency bands, and thus improves isolation between them.

Figure 10:
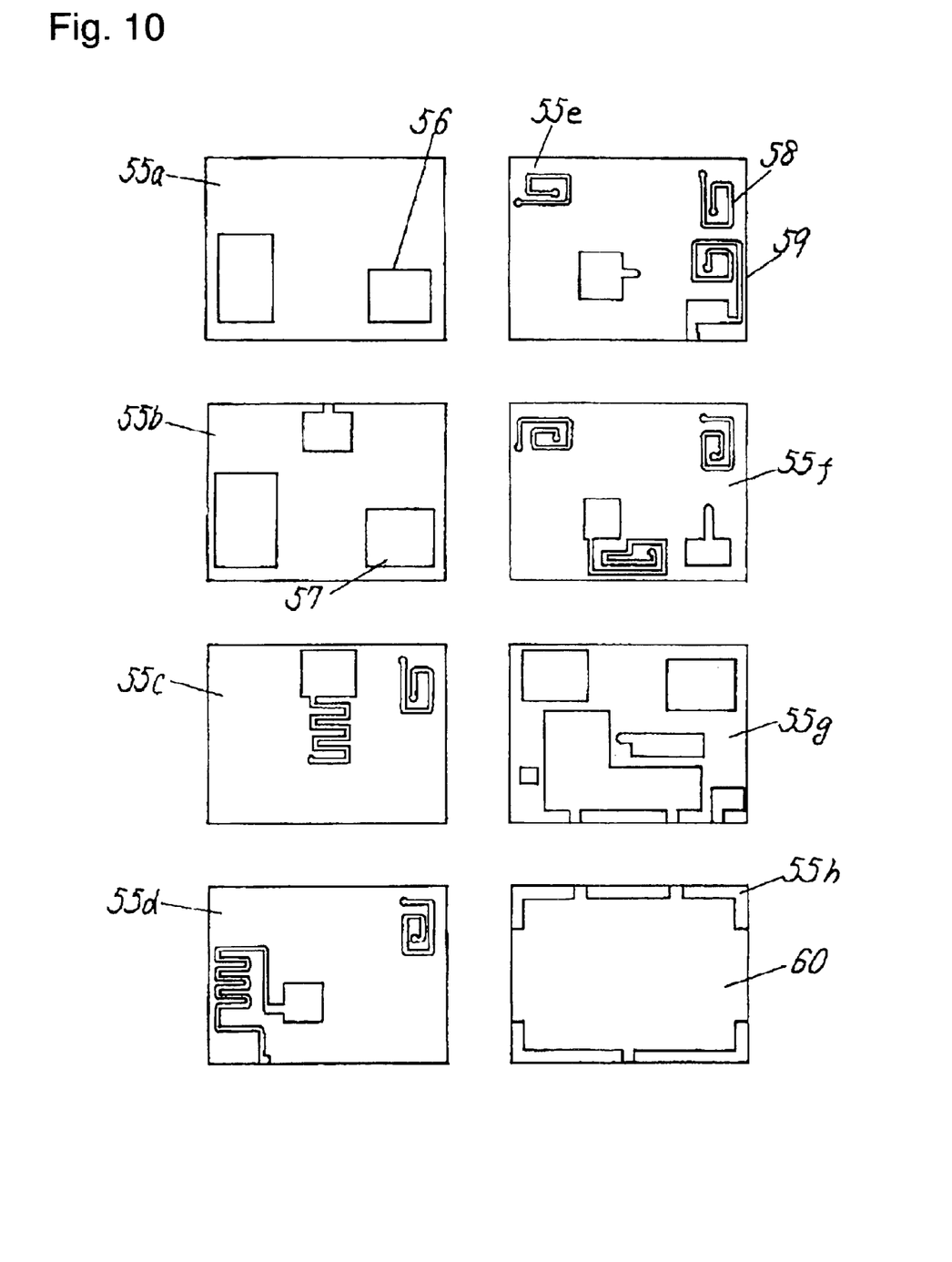
FIG. 10 shows an internal structure of the RF switch module in accordance with the embodiment.

FIG. 10 shows an internal structure of the laminated body of the RF hybrid switch module in accordance with the embodiment of the present invention. The laminated body is formed of dielectric layers 55$a$ through 55$h$. Capacitor C4 is formed of a capacitance between capacitor electrodes 56 and 57. Terminal C4$a$ of the capacitor near the ground shown in the equivalent circuit of FIG. 2 is formed of electrode 57 which is nearer than electrode 56 to grounding electrode 60. This arrangement reduces a parasitic capacitance between electrode 56 and grounding electrode 60, and thus provides an RF hybrid switch module operating efficiently.

Electrode 57 near grounding electrode 60 has a larger size than electrode 56. This arrangement reduces a parasitic capacitance between electrode 56 and grounding electrode 60. This arrangement further provides a capacitor having a stable capacitance which is not affected seriously by a positional deviation in printing or laminating during its manufacturing.

Adjoining spiral electrodes 58 and 59 in the laminated body form inductors L5 and L1 shown in the equivalent circuit of FIG. 2, respectively. The spiral inductors are formed in the same spiral direction in consideration for a signal pass. This arrangement reduces influence of coupling between their spiral patterns.

An electrode relating to a transmitting function may be formed on a dielectric layer which is farther from the grounding electrode than a dielectric layer on which an electrode pattern relating a receiving function is formed. This arrangement reduces a coupling between transmitting circuits and receiving circuits, and shorten electrical wiring, thus providing an RF hybrid switch module operating efficiently.

INDUSTRIAL APPLICABILITY

The present invention provides a small radio frequency (RF) hybrid switch module operating efficiently used in a mobile communication device such as a cellular phone. The module includes a dividing circuit, a switching circuit, a low pass filter, and a surface acoustic wave (SAW) filter corresponding to plural frequency bands integrated.

What is claimed is:

1. A radio frequency (RF) hybrid switch module for switching between signals of a plurality frequency bands, comprising:

a dividing circuit;

a switching circuit;

a low pass filter (LPF);

an electrode pattern forming at least a portion of said dividing circuit, said switching circuit, and said LPF;

a laminated body including a plurality of dielectric layers, said electrode, pattern being formed on at least one of said dielectric layers;

a surface acoustic wave (SAW) filter corresponding to the frequency bands, having a grounding port, being mounted on said laminated body;

a diode mounted on said laminated body, for forming a portion of said switching circuit;

a grounding electrode formed in said laminated body; and a via-conductor directly connecting said grounding port with said grounding electrode;

wherein said grounding electrode is formed on a farthest dielectric layer of said dielectric layers from a dielectric layer having said SAW filter mounted on said laminated body, or on a dielectric layer near said farthest dielectric layer.

2. The RF hybrid switch module of claim 1, wherein said grounding port is directly connected with said grounding electrode through a plurality of said via-conductors.

3. A radio frequency (RF) hybrid switch module for switching between signals of a plurality of frequency bands, comprising:

a dividing circuit
a switching circuit;
a low pass filter (LPF);
an electrode pattern forming at least a portion of said dividing circuit, said switching circuit, and said LPF;
a laminated body including a plurality of dielectric layers, said electrode pattern being formed on at least one of said dielectric layers;
a surface acoustic wave (SAW) filter corresponding to the frequency bands, having a grounding port, being mounted on said laminated body;
a diode mounted on said laminated body, for forming a portion of said switching circuit;
a grounding electrode formed in said laminated body; and
a via-conductor directly connecting said grounding port with said grounding electrode,
wherein the frequency bands include first and second frequency bands,
wherein at least one of said dividing circuit, switching circuit, and LPF includes first and second portions corresponding to the first and second frequency bands, respectively,
wherein said SAW filter includes:
 a first SAW element corresponding to the first frequency band; and
 a second SAW element corresponding to the second frequency band, said first and second SAW elements being disposed adjacent each other substantially on a center of said laminated body,
wherein said first portion is disposed in a first region of said laminated body near said first SAW element, and
wherein said second portion is disposed in a second region of said laminated body near said second SAW element.

4. The RF hybrid switch module of claim 3, wherein said grounding port is directly connected with said grounding electrode through a plurality of said via-conductors.

5. The RF hybrid switch module of claim 3, further comprising:
 a first transmitting terminal for the first frequency band, being formed in said first region;
 a first receiving terminal for the first frequency bend, being formed in said first region at an opposite side to said first transmitting terminal;
 a second transmitting terminal for the second frequency band, being formed in said second region; and
 a second receiving terminal for the second frequency band, being formed in said second region at an opposite side to said second transmitting terminal.

6. A radio frequency (RF) hybrid switch module for switching between signals of a plurality of frequency bands, comprising;
 a dividing circuit;
 a switching circuit;
 a low pass filter (LPF);
 an electrode pattern forming at least a portion of said dividing circuit, said switching circuit, and said LPF;
 a laminated body including a plurality of dielectric layers, said electrode pattern being formed on at least one of said dielectric layers;
 a surface acoustic wave (SAW) filter corresponding to the frequency bands, having a grounding port, being mounted on said laminated body;
 a diode mounted on said laminated body, for forming a portion of said switching circuit;
 a grounding electrode formed in said laminated body;
 a via-conductor directly connecting said grounding port with said grounding electrode;
 a first transmitting terminal formed on said laminated body;
 a first receiving terminal formed on said laminated body;
 a second transmitting terminal formed on said laminated body; and
 a second receiving terminal formed on said laminated body,
wherein the frequency bands include first and second frequency bands,
wherein said first transmitting terminal and said first receiving terminal correspond to the first frequency band,
wherein said second transmitting terminal and said second receiving terminal correspond to the second frequency band,
wherein said SAW filter includes:
 a first SAW element corresponding to the first frequency band; and
 a second SAW element corresponding to the second frequency band, said first and second SAW elements disposed adjacent to each other substantially on a center of said laminated body,
wherein said first transmitting terminal and said first receiving terminal are formed in a first region of said laminated body near said first SAW element, and
wherein said second transmitting terminal and said second receiving terminal are formed in a second region of said laminated body near said second SAW element.

7. The RF hybrid switch module of claim 6, further comprising:
 a first conductor formed on said laminated body between said first transmitting terminal and said first receiving terminal; and
 a second conductor formed on said laminated body between said second transmitting terminal and said second receiving terminal.

8. The RF hybrid switch module of claim 6,
wherein said first transmitting terminal and said first receiving terminal are formed near respective edges of said laminated body, said edges being opposite to each other in a disposing direction of said first and second SAW elements, and
wherein said second transmitting terminal and said second receiving terminal are formed near respective edges of said laminated body, said edges being opposite to each other in the disposing direction of said first and second SAW elements.

9. The RF hybrid switch module of claim 6, wherein at least one of said dividing circuit, switching circuit, and LPF includes;
 a first portion formed in said first region, corresponding to the first frequency band; and
 a second portion formed in said second region, corresponding to the second frequency band.

10. The RF hybrid switch module of claim 6, wherein said grounding port is directly connected with said grounding electrode through a plurality of said via-conductors.

11. A radio frequency (RF) hybrid switch module for switching between signals of a plurality of frequency bands, comprising:

a dividing circuit;
a switching circuit;
a low pass filter (LPF);
an electrode pattern forming at least a portion of said dividing circuit, said switching circuit, and said LPF;
a laminated body including a plurality of dielectric layers, said electrode pattern being formed on at least one of said dielectric layers,
a surface acoustic wave (SAW) filter corresponding to the frequency bands, having a grounding port, being mounted on said laminated body;
a diode mounted on said laminated body, for forming a portion of said switching circuit;
a grounding electrode formed in said laminated body;
a via-conductor directly connecting said grounding port with said grounding electrode;
a first transmitting terminal formed on said laminated body;
a first receiving terminal formed on said laminated body;
a second transmitting terminal formed on said laminated body; and
a second receiving terminal formed on said laminated body,
wherein the frequency bands include first and second frequency bands,
wherein said first transmitting terminal and said first receiving terminal correspond to the first frequency band,
wherein said second transmitting terminal and said second receiving terminal correspond to the second frequency band,
wherein said SAW filter includes:
a first SAW element corresponding to the first frequency band; and
a second SAW element corresponding to the second frequency band, said first and second SAW elements being disposed adjacent to each other on a side of said laminated body in parallel with said side,
wherein said first transmitting terminal and said first receiving terminal are formed in a first region of said laminated body near said first SAW element, and
wherein said second transmitting terminal and said second receiving terminal are formed in a second region of said laminated body near said second SAW element.

12. The RF hybrid, switch module of claim 11,
wherein said first transmitting terminal and said first receiving terminal are formed near respective edges of said laminated body, said edges being opposite to each other in a disposing direction of said first and second SAW elements,
wherein said second transmitting terminal and said second receiving terminal are formed near respective edges of said laminated body, said edges being opposite to each other in the disposing direction of said first and second SAW elements.

13. The RF hybrid switch module of claim 11, wherein at least one of said dividing circuit, switching circuit, and LPF includes:
a first portion formed in said first region, corresponding to the first frequency band; and
a second portion formed in said second region, corresponding to the second frequency band.

14. The RF hybrid switch module of claim 11, further comprising:

a first conductor formed on said laminated body between said first transmitting terminal and said first receiving terminal; and
a second conductor formed on said laminated body between said second transmitting terminal and said second receiving terminal.

15. The RF hybrid switch module of claim 11, wherein said grounding port is directly connected with said grounding electrode through a plurality of said via-conductors.

16. A radio frequency (RF) hybrid switch module for switching between signals of a plurality of frequency bands, comprising:
a dividing circuit;
a switching circuit;
a low pass filter (LPF);
an electrode pattern forming at least a portion of said dividing circuit, said switching circuit, and said LPF;
a laminated body Including a plurality of dielectric layers, said electrode pattern being formed on at least one of said dielectric layers;
a surface acoustic wave (SAW) filter corresponding to the frequency bands, having a grounding port, being mounted on said laminated body;
a diode mounted on said laminated body, for forming a portion of said switching circuit
a grounding electrode formed in said laminated body; and
a via-conductor directly connecting said grounding port with said grounding electrode,
wherein said electrode pattern includes spiral electrode patterns formed in an identical spiral direction, said spiral electrode patterns adjoining to each other.

17. The RF hybrid switch module of claim 16, wherein said grounding port is directly connected with geld grounding electrode through a plurality of said via-conductors.

18. A radio frequency (RF), hybrid switch module for switching between signals of a plurality of frequency bands, comprising:
a dividing circuit;
a switching circuit;
a low pass filter (LPF);
an electrode pattern forming at least a portion of said dividing circuit, said switching circuit, and said LPF;
a laminated body Including a plurality of dielectric layers, said electrode pattern being formed on at least one of said dielectric layers;
a surface acoustic (SAW) filter corresponding to the frequency bands, having a grounding port, being mounted on said laminated body;
a diode mounted on said laminated body, for forming a portion of said switching circuit;
a grounding electrode formed in said laminated body; and
a via-conductor directly connecting said grounding port with said grounding electrode,
wherein said electrode pattern includes:
a first electrode pattern relating to a receiving function of said dividing circuit switching circuit, and LPF; and
a second electrode pattern relating to a transmitting function of said dividing circuit, switching circuit, and LPF,
wherein said first electrode pattern is formed on a first dielectric layer of said dielectric layers,
wherein said second electrode pattern is formed on a second dielectric layer of said dielectric layers, said second dielectric layer being farther from said grounding electrode than said first dielectric layer.

19. The RF hybrid switch module of claim 18, wherein said grounding port is directly connected with said grounding electrode through a plurality of said via-conductors.

20. A radio frequency (RF) hybrid switch module for switching between signals of a plurality of frequency bands, comprising:

a dividing circuit;

a switching circuit;

a low pass filter (LPF);

an electrode pattern forming at least a portion of said dividing circuit, said switching circuit, and said LPF;

a laminated body including a plurality of dielectric layers, said electrode pattern being formed on at least one of said dielectric layers;

a surface acoustic wave (SAW) filter corresponding to the frequency bands, having a grounding port, being mounted on said laminated body;

diode mounted on said laminated body, for forming a portion of said switching circuit;

a grounding electrode formed in said laminated body; and a via-conductor directly connecting said grounding pert with said grounding electrode, wherein at least one of said dividing circuit, said switching circuit, and said LPF includes:

a first capacitor electrode on a first dielectric layer of said dielectric layers; and a second capacitor electrode on a second dielectric layer of said dielectric layers, said second dielectric layer being nearer to said grounding electrode than said first dielectric layer;

wherein said second capacitor electrode is nearer a ground in a equivalent circuit of said at least one of said dividing circuit, said switching circuit, and said LPF than said first capacitor electrode and wherein said first capacitor electrode has a different size from said second capacitor electrode.

21. The RF hybrid switch module of claim 20, wherein said second capacitor electrode is larger than said first capacitor electrode.

22. The RF hybrid switch module of claim 20, wherein said grounding port is directly connected with said grounding electrode through a plurality of said via-conductors.

* * * * *

UNITED STATES PATENT AND TRADEMARK OFFICE
CERTIFICATE OF CORRECTION

PATENT NO. : 6,856,213 B2
DATED : February 15, 2005
INVENTOR(S) : Tetsuya Tsurunari et al.

It is certified that error appears in the above-identified patent and that said Letters Patent is hereby corrected as shown below:

Column 7,
Line 45, "first frequency bend," should read -- first frequency band --.

Column 10,
Line 19, "a laminated body Including" should read -- a laminated body including --.
Line 34, "with geld grounding electrode" should read -- with said grounding electrode --.
Line 45, "a laminated body Including" should read -- a laminated body including --.

Column 11,
Line 21, "diode mounted on" should read -- a diode mounted on --.

Column 12,
Line 1, "grounding pert" should read -- grounding port --.

Signed and Sealed this

Twelfth Day of July, 2005

JON W. DUDAS
*Director of the United States Patent and Trademark Office*